(12) United States Patent
Lim et al.

(10) Patent No.: US 10,103,627 B2
(45) Date of Patent: Oct. 16, 2018

(54) PACKAGED INTEGRATED CIRCUIT INCLUDING A SWITCH-MODE REGULATOR AND METHOD OF FORMING THE SAME

(71) Applicant: Altera Corporation, San Jose, CA (US)

(72) Inventors: Teik Wah Lim, Bayan Lepas (MY); Ashraf W. Lotfi, Bridgewater, NJ (US); Choong Kit Wong, Bayan Lepas (MY); John Weld, Ledgewood, NJ (US)

(73) Assignee: Altera Corporation, San Jose, CA (US)

( * ) Notice: Subject to any disclaimer, the term of this patent is extended or adjusted under 35 U.S.C. 154(b) by 89 days.

(21) Appl. No.: 14/632,641

(22) Filed: Feb. 26, 2015

(65) Prior Publication Data

US 2016/0254745 A1    Sep. 1, 2016

(51) Int. Cl.
*H02M 3/158* (2006.01)
*H01L 25/065* (2006.01)
(Continued)

(52) U.S. Cl.
CPC ............ *H02M 3/158* (2013.01); *H01L 23/04* (2013.01); *H01L 25/0652* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 2224/04042* (2013.01); *H01L 2224/05554* (2013.01); *H01L 2224/131* (2013.01); *H01L 2224/16227* (2013.01); *H01L 2224/16235* (2013.01); *H01L 2224/2919* (2013.01); *H01L 2224/32245* (2013.01);
(Continued)

(58) Field of Classification Search
CPC ..................................................... H02M 3/158
See application file for complete search history.

(56) References Cited

U.S. PATENT DOCUMENTS

| 4,761,725 A | 8/1988 | Henze |
| 4,918,026 A | 4/1990 | Kosiak et al. |

(Continued)

FOREIGN PATENT DOCUMENTS

| CN | 101409281 A | 4/2009 |
| CN | 101952961 A | 1/2011 |

(Continued)

OTHER PUBLICATIONS

From Sand to Silicon "Making of a Chip" Illustrations, May 2009, Intel Coporation.*

(Continued)

*Primary Examiner* — Thomas J Hiltunen
(74) *Attorney, Agent, or Firm* — Fletcher Yoder PC

(57) ABSTRACT

A packaged integrated circuit and method of forming the same. The package integrated circuit includes an integrated circuit formed on a semiconductor die affixed to a surface of a multi-layer substrate, and a switch-mode regulator formed on the semiconductor die (or another semiconductor die) affixed to the surface of the multi-layer substrate. The integrated circuit and the switch-mode regulator are integrated within a package to form the packaged integrated circuit.

20 Claims, 8 Drawing Sheets

(51) Int. Cl.
  *H01L 23/04* (2006.01)
  *H01L 23/00* (2006.01)
(52) U.S. Cl.
  CPC .............. *H01L 2224/48091* (2013.01); *H01L 2224/48105* (2013.01); *H01L 2224/48227* (2013.01); *H01L 2224/48464* (2013.01); *H01L 2224/73253* (2013.01); *H01L 2924/00014* (2013.01); *H01L 2924/15311* (2013.01); *H01L 2924/1676* (2013.01); *H01L 2924/16724* (2013.01); *H01L 2924/16747* (2013.01); *H01L 2924/19105* (2013.01)

(56) References Cited

U.S. PATENT DOCUMENTS

| | | | |
|---|---|---|---|
| 4,922,327 | A | 5/1990 | Mena et al. |
| 4,947,192 | A | 8/1990 | Hawkins et al. |
| 4,982,353 | A | 1/1991 | Jacob et al. |
| 5,014,098 | A | 5/1991 | Schlais et al. |
| 5,029,283 | A | 7/1991 | Ellsworth et al. |
| 5,047,358 | A | 9/1991 | Kosiak et al. |
| 5,156,989 | A | 10/1992 | Williams et al. |
| 5,169,794 | A | 12/1992 | Iranmanesh |
| 5,264,782 | A | 11/1993 | Newton |
| 5,285,369 | A | 2/1994 | Balakrishnan |
| 5,321,319 | A | 6/1994 | Mahmood |
| 5,366,916 | A | 11/1994 | Summe et al. |
| 5,405,791 | A | 4/1995 | Ahmad et al. |
| 5,407,844 | A | 4/1995 | Smayling et al. |
| 5,469,334 | A | 11/1995 | Balakrishnan |
| 5,485,027 | A | 1/1996 | Williams et al. |
| 5,504,450 | A | 4/1996 | McPartland |
| 5,594,324 | A | 1/1997 | Canter et al. |
| 5,610,421 | A | 3/1997 | Coneiero et al. |
| 5,644,266 | A | 7/1997 | Chen et al. |
| 5,668,024 | A | 9/1997 | Tsai |
| 5,689,213 | A | 11/1997 | Sher |
| 5,710,054 | A | 1/1998 | Gardner et al. |
| 5,757,045 | A | 5/1998 | Tsai et al. |
| 5,786,630 | A * | 7/1998 | Bhansali ........... H01L 23/49822 257/697 |
| 5,833,585 | A | 11/1998 | Jones et al. |
| 5,859,606 | A | 1/1999 | Schrader et al. |
| 5,877,611 | A | 3/1999 | Brkovic |
| 5,888,861 | A | 3/1999 | Chien et al. |
| 5,889,315 | A | 3/1999 | Farrenkopf et al. |
| 5,899,732 | A | 5/1999 | Gardner et al. |
| 5,930,642 | A | 7/1999 | Moore et al. |
| 5,982,645 | A | 11/1999 | Levran et al. |
| 6,005,377 | A | 12/1999 | Chen et al. |
| 6,022,778 | A | 2/2000 | Contiero et al. |
| 6,118,351 | A | 9/2000 | Kossives et al. |
| 6,166,989 | A | 12/2000 | Hamamoto et al. |
| 6,204,542 | B1 | 3/2001 | Kinoshita et al. |
| 6,215,076 | B1 * | 4/2001 | Inagawa ............ H05K 1/0216 174/250 |
| 6,250,127 | B1 * | 6/2001 | Polese ................ C22C 32/0063 72/256 |
| 6,255,714 | B1 | 7/2001 | Kossives |
| 6,262,564 | B1 | 7/2001 | Kanamori |
| 6,271,063 | B1 | 8/2001 | Chan et al. |
| 6,285,539 | B1 | 9/2001 | Kashimoto et al. |
| 6,288,424 | B1 | 9/2001 | Ludikhuize |
| 6,297,108 | B1 | 10/2001 | Chu |
| 6,320,449 | B1 | 11/2001 | Capici et al. |
| 6,333,217 | B1 | 12/2001 | Umimoto et al. |
| 6,365,475 | B1 | 4/2002 | Cheng et al. |
| 6,380,004 | B2 | 4/2002 | Boden, Jr. et al. |
| 6,384,447 | B2 | 5/2002 | Mihnea et al. |
| 6,384,643 | B1 | 5/2002 | Grose et al. |
| 6,388,468 | B1 | 5/2002 | Li |
| 6,392,275 | B1 | 5/2002 | Jang |
| 6,407,579 | B1 | 6/2002 | Goswick |
| 6,413,806 | B1 | 7/2002 | Sicard et al. |
| 6,420,771 | B2 | 7/2002 | Gregory |
| 6,477,065 | B2 | 11/2002 | Parks |
| 6,495,019 | B1 | 12/2002 | Filas et al. |
| 6,521,960 | B2 | 2/2003 | Lee |
| 6,541,819 | B2 | 4/2003 | Lotfi et al. |
| 6,545,360 | B1 | 4/2003 | Ohkubo et al. |
| 6,550,666 | B2 | 4/2003 | Chew et al. |
| 6,573,694 | B2 | 6/2003 | Pulkin et al. |
| 6,650,169 | B2 | 11/2003 | Faye et al. |
| 6,653,174 | B1 | 11/2003 | Cho et al. |
| 6,688,985 | B2 | 2/2004 | Weiss et al. |
| 6,730,962 | B2 | 5/2004 | Wu |
| 6,744,676 | B2 | 6/2004 | Leung et al. |
| 6,765,272 | B2 | 7/2004 | Natsume |
| 6,791,305 | B2 | 9/2004 | Imai et al. |
| 6,822,882 | B1 | 11/2004 | Jacobs et al. |
| 6,833,585 | B2 | 12/2004 | Kim et al. |
| 6,855,985 | B2 | 2/2005 | Williams et al. |
| 6,873,017 | B2 | 3/2005 | Cai et al. |
| 6,879,137 | B2 | 4/2005 | Sase |
| 6,900,101 | B2 | 5/2005 | Lin |
| 6,911,694 | B2 | 6/2005 | Negro et al. |
| 6,943,447 | B2 * | 9/2005 | Ishizuki ............... H05K 1/0221 156/233 |
| 6,960,512 | B2 | 11/2005 | Cheng et al. |
| 6,992,377 | B2 * | 1/2006 | Zhou ................. H01L 23/49838 257/690 |
| 6,998,674 | B2 | 2/2006 | Osada et al. |
| 7,012,323 | B2 * | 3/2006 | Warner ............... H01F 17/0033 257/676 |
| 7,012,792 | B2 | 3/2006 | Yoshida |
| 7,015,544 | B2 | 3/2006 | Lotfi et al. |
| 7,019,505 | B2 | 3/2006 | Dwarakanath et al. |
| 7,038,438 | B2 | 5/2006 | Dwarakanath et al. |
| 7,071,044 | B1 | 7/2006 | Krishnan et al. |
| 7,074,684 | B2 | 10/2006 | Roy et al. |
| 7,129,143 | B2 | 10/2006 | Park |
| 7,186,606 | B2 | 3/2007 | Lotfi et al. |
| 7,190,026 | B2 | 3/2007 | Lotfi et al. |
| 7,195,981 | B2 | 3/2007 | Lotfi et al. |
| 7,211,516 | B2 | 5/2007 | Lotfi et al. |
| 7,214,985 | B2 | 5/2007 | Lotfi et al. |
| 7,229,886 | B2 | 6/2007 | Lotfi et al. |
| 7,230,302 | B2 | 6/2007 | Lotfi et al. |
| 7,230,316 | B2 | 6/2007 | Yamazaki et al. |
| 7,232,733 | B2 | 6/2007 | Lotfi et al. |
| 7,232,762 | B2 | 6/2007 | Chang et al. |
| 7,244,994 | B2 | 7/2007 | Lotfi et al. |
| 7,256,674 | B2 | 8/2007 | Lotfi et al. |
| 7,262,476 | B2 | 8/2007 | Bude et al. |
| 7,276,998 | B2 | 10/2007 | Lotfi et al. |
| 7,330,017 | B2 | 2/2008 | Dwarakanath et al. |
| 7,335,948 | B2 | 2/2008 | Lotfi et al. |
| 7,344,985 | B2 | 3/2008 | Chen et al. |
| 7,355,217 | B1 | 4/2008 | Brand |
| 7,355,255 | B2 | 4/2008 | Chen et al. |
| 7,365,402 | B2 | 4/2008 | Ma |
| 7,391,080 | B2 | 6/2008 | Arnborg et al. |
| 7,408,211 | B2 | 8/2008 | Kao |
| 7,420,247 | B2 | 9/2008 | Xu et al. |
| 7,422,967 | B2 | 9/2008 | DeLoach et al. |
| 7,422,968 | B2 | 9/2008 | Lu et al. |
| 7,426,780 | B2 | 9/2008 | Lotfi et al. |
| 7,462,317 | B2 | 12/2008 | Lotfi et al. |
| 7,489,007 | B2 | 2/2009 | Williams et al. |
| 7,511,350 | B2 | 3/2009 | Chen et al. |
| 7,544,558 | B2 | 6/2009 | Ren et al. |
| 7,544,995 | B2 | 6/2009 | Lotfi et al. |
| 7,598,606 | B2 | 10/2009 | Williams et al. |
| 7,605,428 | B2 | 10/2009 | Williams et al. |
| 7,626,233 | B2 | 12/2009 | Tornblad et al. |
| 7,679,342 | B2 | 3/2010 | Lopata et al. |
| 7,683,426 | B2 | 3/2010 | Williams et al. |
| 7,683,453 | B2 | 3/2010 | Willliams et al. |
| 7,710,094 | B1 | 5/2010 | Wong et al. |
| 7,719,054 | B2 | 5/2010 | Williams et al. |
| 7,759,184 | B2 | 6/2010 | Lotfi et al. |
| 7,788,608 | B2 * | 8/2010 | Huynh ................. H05K 7/1092 716/127 |

(56) References Cited

U.S. PATENT DOCUMENTS

| | | | |
|---|---|---|---|
| 7,812,393 B2 | 10/2010 | Williams | |
| 7,876,080 B2 | 1/2011 | Dwarankanath et al. | |
| 7,892,931 B2 | 2/2011 | Sridhar et al. | |
| 7,904,864 B2* | 3/2011 | Huynh | G06F 17/5072 716/118 |
| 7,952,160 B2* | 5/2011 | Triantafillou | H01L 23/645 257/499 |
| 7,952,459 B2 | 5/2011 | Lotfi et al. | |
| 7,964,484 B2 | 6/2011 | Osada et al. | |
| 8,040,212 B2* | 10/2011 | Ikriannikov | H01F 17/06 336/192 |
| 8,099,619 B2* | 1/2012 | Dibene | G06F 1/26 323/282 |
| 8,101,479 B2 | 1/2012 | Parker | |
| 8,212,315 B2 | 7/2012 | Lotfi et al. | |
| 8,212,316 B2 | 7/2012 | Lotfi et al. | |
| 8,212,317 B2 | 7/2012 | Lotfi et al. | |
| 8,253,195 B2 | 8/2012 | Lotfi et al. | |
| 8,253,196 B2 | 8/2012 | Lotfi et al. | |
| 8,253,197 B2 | 8/2012 | Lotfi et al. | |
| 8,258,575 B2 | 9/2012 | Williams et al. | |
| 8,520,402 B1 | 8/2013 | Sivasubramaniam | |
| 8,604,597 B2* | 12/2013 | Jiang | H01L 23/49572 257/676 |
| 8,618,580 B2 | 12/2013 | Lin et al. | |
| 8,633,540 B2 | 1/2014 | Lotfi et al. | |
| 8,716,790 B2 | 5/2014 | Lotfi et al. | |
| 8,860,390 B2* | 10/2014 | Tam | H01F 38/00 323/232 |
| 8,872,609 B2* | 10/2014 | Kuroda | H01F 17/0006 336/84 C |
| 8,987,815 B2 | 3/2015 | Lotfi et al. | |
| 8,994,469 B2* | 3/2015 | Lin | H04B 3/32 333/1 |
| 9,083,332 B2* | 7/2015 | Ikriannikov | H02M 3/1582 |
| 9,087,392 B2* | 7/2015 | Doyle | G06T 15/005 |
| 9,118,242 B2* | 8/2015 | Chang | G06F 1/26 |
| 9,299,691 B2 | 3/2016 | Lotfi et al. | |
| 2002/0164844 A1 | 11/2002 | Cai et al. | |
| 2002/0175366 A1 | 11/2002 | Lotfi et al. | |
| 2002/0185681 A1 | 12/2002 | Nakano et al. | |
| 2003/0011424 A1* | 1/2003 | Moon | H03K 19/00361 327/565 |
| 2003/0109112 A1 | 6/2003 | Wu | |
| 2003/0147226 A1* | 8/2003 | Devey | H05K 1/0231 361/782 |
| 2004/0094806 A1 | 5/2004 | Shillaci et al. | |
| 2004/0121547 A1 | 6/2004 | Lee et al. | |
| 2004/0227190 A1 | 11/2004 | Cai et al. | |
| 2005/0110080 A1 | 5/2005 | Amborg et al. | |
| 2005/0112822 A1 | 5/2005 | Litwin | |
| 2005/0167756 A1 | 8/2005 | Lotfi et al. | |
| 2005/0168203 A1 | 8/2005 | Dwarakanath et al. | |
| 2005/0168205 A1 | 8/2005 | Dwarakanath et al. | |
| 2005/0169024 A1 | 8/2005 | Dwarakanath et al. | |
| 2005/0179084 A1 | 8/2005 | Robb et al. | |
| 2005/0179472 A1 | 8/2005 | Nakamura et al. | |
| 2005/0194639 A1 | 9/2005 | Negoro et al. | |
| 2006/0027864 A1 | 2/2006 | Negoro et al. | |
| 2006/0038225 A1 | 2/2006 | Lotfi et al. | |
| 2006/0038237 A1 | 2/2006 | Lotfi et al. | |
| 2006/0038238 A1 | 2/2006 | Lotfi et al. | |
| 2006/0039224 A1 | 2/2006 | Lotfi et al. | |
| 2006/0040441 A1 | 2/2006 | Lotfi et al. | |
| 2006/0040449 A1 | 2/2006 | Lotfi et al. | |
| 2006/0040451 A1 | 2/2006 | Lotfi et al. | |
| 2006/0040452 A1 | 2/2006 | Lotfi et al. | |
| 2006/0081937 A1 | 4/2006 | Lotfi et al. | |
| 2006/0145250 A1 | 7/2006 | Ma | |
| 2006/0278931 A1 | 12/2006 | Lee et al. | |
| 2007/0224752 A1 | 9/2007 | Lotfi et al. | |
| 2007/0284658 A1 | 12/2007 | Lotfi et al. | |
| 2008/0001233 A1 | 1/2008 | Kapoor et al. | |
| 2008/0061368 A1 | 3/2008 | Williams et al. | |
| 2008/0061400 A1 | 3/2008 | Williams et al. | |
| 2008/0067585 A1 | 3/2008 | Williams et al. | |
| 2008/0067586 A1 | 3/2008 | Williams et al. | |
| 2008/0067588 A1 | 3/2008 | Williams et al. | |
| 2008/0080111 A1 | 4/2008 | Lin et al. | |
| 2008/0142899 A1 | 6/2008 | Morris et al. | |
| 2008/0153221 A1 | 6/2008 | Sridhar et al. | |
| 2008/0157726 A1 | 7/2008 | Majcherczak et al. | |
| 2008/0199999 A1 | 8/2008 | Weijtmans et al. | |
| 2008/0242032 A1 | 10/2008 | Chakravarthi et al. | |
| 2008/0272829 A1* | 11/2008 | Maeda | H01L 23/5389 327/518 |
| 2008/0301929 A1 | 12/2008 | Lotfi et al. | |
| 2009/0065964 A1 | 3/2009 | Lotfi et al. | |
| 2009/0096435 A1 | 4/2009 | Ueunten | |
| 2009/0096511 A1 | 4/2009 | Ueunten | |
| 2009/0167267 A1 | 7/2009 | Dwarakanath et al. | |
| 2009/0212751 A1 | 8/2009 | Cervera et al. | |
| 2009/0261791 A1 | 10/2009 | Lopata et al. | |
| 2009/0269899 A1 | 10/2009 | Osada et al. | |
| 2009/0296310 A1 | 12/2009 | Chikara | |
| 2010/0039836 A1 | 2/2010 | Gong et al. | |
| 2010/0044789 A1 | 2/2010 | Lotfi et al. | |
| 2010/0052050 A1 | 3/2010 | Lotfi et al. | |
| 2010/0052051 A1 | 3/2010 | Lotfi et al. | |
| 2010/0052052 A1 | 3/2010 | Lotfi et al. | |
| 2010/0156374 A1 | 6/2010 | Lopata et al. | |
| 2010/0164449 A1 | 7/2010 | Dwarakanath et al. | |
| 2010/0164650 A1 | 7/2010 | Abou-Alfotouh et al. | |
| 2010/0244106 A1 | 9/2010 | Parker et al. | |
| 2010/0244152 A1 | 9/2010 | Bahl | |
| 2010/0301496 A1 | 12/2010 | Koduri | |
| 2011/0006763 A1 | 1/2011 | Bakker | |
| 2011/0031947 A1 | 2/2011 | You | |
| 2011/0049621 A1 | 3/2011 | Lotfi et al. | |
| 2011/0074498 A1 | 3/2011 | Thompson et al. | |
| 2011/0095742 A1 | 4/2011 | Lopata et al. | |
| 2011/0101933 A1 | 5/2011 | Lopata et al. | |
| 2011/0101934 A1 | 5/2011 | Lopata et al. | |
| 2011/0101948 A1 | 5/2011 | Lopata et al. | |
| 2011/0101949 A1 | 5/2011 | Lopata et al. | |
| 2011/0215414 A1 | 9/2011 | Osada et al. | |
| 2011/0221000 A1 | 9/2011 | Shima | |
| 2011/0316053 A1 | 12/2011 | Brand | |
| 2012/0074922 A1 | 3/2012 | Suzuki et al. | |
| 2013/0151825 A1 | 6/2013 | Huynh | |
| 2015/0280558 A1 | 10/2015 | Lopata et al. | |
| 2015/0302974 A1* | 10/2015 | Zhao | H01F 17/0013 361/270 |
| 2015/0302976 A1* | 10/2015 | Chang | H01L 23/5227 336/84 M |

FOREIGN PATENT DOCUMENTS

| | | |
|---|---|---|
| EP | 2278345 A2 | 1/2011 |
| TW | 200816374 A | 4/2008 |
| TW | 200847330 A | 12/2008 |
| TW | 201120459 A | 6/2011 |
| TW | 201225298 A | 6/2012 |

OTHER PUBLICATIONS

Jimb0, Integrated Circuits, Jul. 15, 2009, Sparkfun, https://learn.sparkfun.com/tutorials/integrated-circuits, accessed on Feb. 7, 2017.*

Publishing dates of tutorials by Jimb0, Sparkfun, https://www.sparkfun.com/users/69916 accessed Feb. 17, 2017.*

Data sheet for LTC3405A-1.5, 2002, Linear Technology Corporation.*

Betancourt-Zamora, R.J. et al., "A 1.5 mW, 200 MHz CMOS VCO for Wireless Biotelemetry," First International Workshop on Design of Mixed-Mode Integrated Circuits and Applications, Cancun, Mexico, pp. 72-74, Jul. 1997.

Goodman, J. et al., "An Energy/Security Scalable Encryp-tion Processor Using an Embedded Variable Voltage DC/DC Converter," IEEE Journal of Solid-State Circuits, vol. 33, No. 11 (Nov. 1998), pp. 1799-1809.

(56) References Cited

OTHER PUBLICATIONS

Horowitz, P., et al., "The Art of Electronics," Second Edi-tion, 1989, pp. 288-291, Cambridge University Press, Cambridge, MA, 6 pgs.

Lotfi, A.W., et al., "Issues and Advances in High-Frequency Magnetics for Switching Power Supplies," Proceedings of the IEEE, Jun. 2001, vol. 89, No. 6, pp. 833-845.

Ludikhuize, A.W., "A Review of RESURF Technology," Proceedings of IEEE ISPSD 2000, May 22, 2000, pp. 11-18.

CN First Office Action for Application No. 201610109675.9 dated Feb. 11, 2018.

* cited by examiner

PACKAGED INTEGRATED CIRCUIT INCLUDING A SWITCH-MODE REGULATOR AND METHOD OF FORMING THE SAME

TECHNICAL FIELD

The present invention is directed, in general, to electronic devices and, in particular, to a packaged integrated circuit including a switch-mode regulator, and method of forming the same.

BACKGROUND

Modern deep sub-micron digital integrated circuits ("ICs") at 50 nanometers ("nm") and smaller and systems on chip ("SOC") exhibit very high transistor density and a need for tight voltage regulation of low voltages at semiconductor die pads internal to the integrated circuit, rather than at physical circuit nodes external to the integrated circuit package. The deep sub-micron integrated circuits, such as digital integrated circuits, and systems on chips that operate at input or bias voltages such as 1.2 volts or less can exhibit high sensitivity to interfering voltages induced into the integrated circuit or systems on chips. Hence, it is advantageous to provide point-of-load power conversion and regulation at the semiconductor die level. This is presently achieved in the integrated circuits by incorporating linear voltage regulators with low drop-out ("LDO") voltages within an integrated circuit package. A drawback of using such linear voltage regulators is higher than desired chip power dissipation due to the dissipative voltage drop thereacross resulting in low power conversion efficiencies, typically in the 20-50 percent range.

Alternatively, switch-mode regulators provide the same voltage conversion capability at much higher efficiencies, typically in the 80-95 percent range, thereby reducing power dissipation by a factor of two or three. To date, however, the switch-mode regulators have not been incorporated into high density integrated circuits due to a mismatch in technologies. This is particularly true with the generation of high-frequency electromagnetic interference, and in silicon fabrication, packaging, assembly, and test, which are all challenging areas, principally for fabrication of digital integrated circuits such as field programmable gate arrays ("FPGAs") constructed with sub-micron structures of dimensions 50 nanometers and less.

What is needed in the art is a technique to integrate a switch-mode regulator with an integrated circuit such as a sub-50 nanometers digital integrated circuit so that it can provide localized, point-of-load regulation at the semiconductor level while maintaining compatibility with silicon assembly and test technologies in a manner that does not introduce intolerable levels of interfering voltages in the integrated circuit package. Due to proximity to the load, silicon noise considerations are a concern, which can be even more challenging than board-level voltage regulation. Techniques to remove, reduce, or otherwise eliminate noise at the semiconductor die level are important, particularly for system on chips that employ sensitive, high speed circuits. A packaged integrated circuit constructed with a switch-mode regulator that does not introduce intolerable levels of circuit noise in nearby circuit elements of the integrated circuit would address an unanswered industry need.

SUMMARY OF THE INVENTION

These and other problems are generally solved or circumvented, and technical advantages are generally achieved, by advantageous embodiments of the present invention, which include a packaged integrated circuit including a switch-mode regulator, and method of forming the same. In one embodiment, the packaged integrated circuit includes an integrated circuit formed on a semiconductor die affixed to a surface of a multi-layer substrate, and a switch-mode regulator formed on the semiconductor die (or another semiconductor die) affixed to the surface of the multi-layer substrate. The integrated circuit and the switch-mode regulator are integrated within a package to form the packaged integrated circuit.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale

DETAILED DESCRIPTION OF ILLUSTRATIVE EMBODIMENTS

The making and using of the presently preferred embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Embodiments will be described in a specific context, namely, a packaged integrated circuit including an integrated circuit formed on a semiconductor die affixed to a surface of a multi-layer substrate such as a multi-layer printed circuit board, and a switch-mode regulator formed on the semiconductor die (or another semiconductor die) affixed to the surface of the multi-layer substrate. The integrated circuit and the switch-mode regulator are encapsulated to form the packaged integrated circuit. While the principles of the present invention will be described in the environment of a packaged digital integrated circuit incorporated on a multi-layer substrate with a switch-mode regulator (also referred to as a power converter), any application or related semiconductor technology that may benefit therefrom is well within the broad scope of the present invention.

Figure 1:
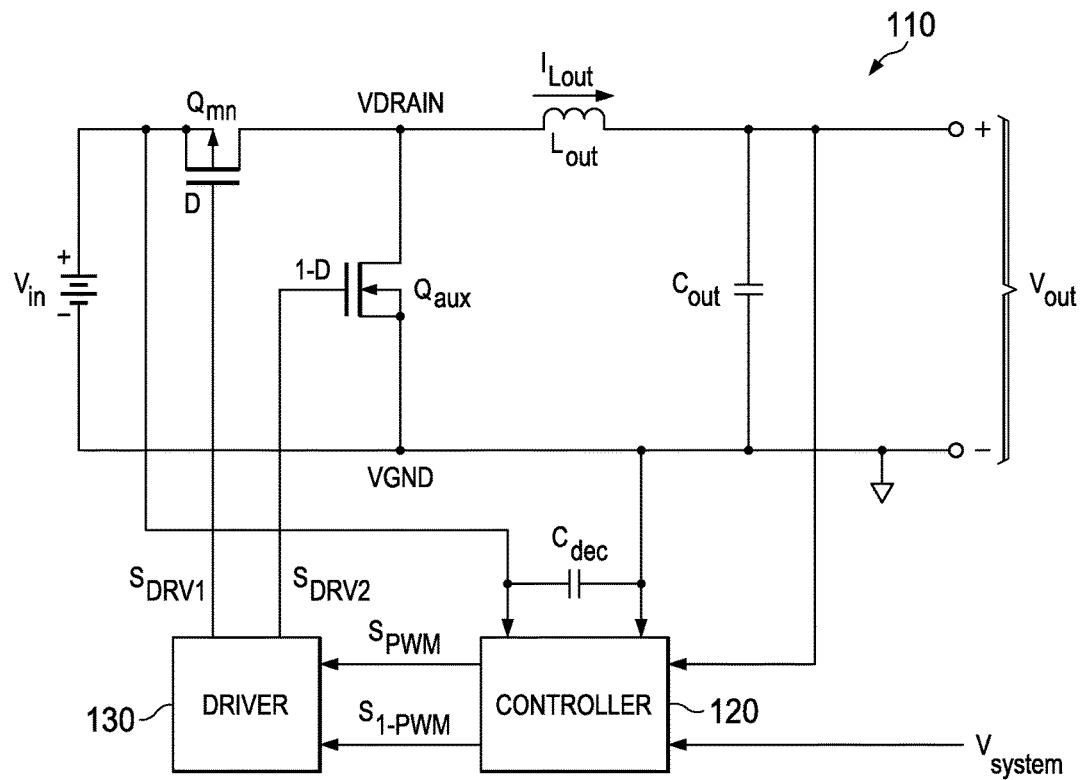
FIG. 1 illustrates a schematic diagram of an embodiment of a power converter including power conversion circuitry employable as a switch-mode regulator.

Referring initially to FIG. 1, illustrated is a schematic diagram of an embodiment of a power converter including power conversion circuitry employable as a switch-mode regulator. The switch-mode regulator includes a power train 110, a controller 120 and a driver 130 and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 receives an input voltage $V_{in}$ from a source of electrical power (represented by a battery) at an input thereof and provides a regulated output voltage $V_{out}$ to power, for instance, a microprocessor at an output thereof. In keeping with the principles of a buck converter topology, the output voltage $V_{out}$ is generally less than the input voltage $V_{in}$ such that a switching operation of the switch-mode regulator can regulate the output voltage $V_{out}$. An active element such as a power semiconductor switch (e.g., a main power semiconductor switch or main power switch $Q_{mn}$) is enabled to conduct for a primary interval (generally co-existent with a primary duty cycle "D" of the main power switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 110. A portion of the inductor current $I_{Lout}$ is filtered by an output filter capacitor $C_{out}$.

During a complementary interval (generally co-existent with a complementary duty cycle "1-D" of the main power switch $Q_{mn}$), the main power switch $Q_{mn}$ is transitioned to a non-conducting state and another active element such as another power semiconductor switch (e.g., an auxiliary power semiconductor switch or auxiliary power switch $Q_{aux}$) is enabled to conduct. The auxiliary power switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary power switches $Q_{mn}$, $Q_{aux}$ may be adjusted to maintain a regulation of the output voltage $V_{out}$ of the power converter. Those skilled in the art should understand, however, that the conduction periods for the main and auxiliary power switches $Q_{mn}$, $Q_{aux}$ may be separated by a small time interval to avoid cross conduction therebetween and beneficially to reduce the switching losses associated with the power converter. The designations VDRAIN and VGND illustrated in FIG. 1 identify, respectively, a drain terminal of the main power switch $Q_{mn}$ and a ground terminal of the switch-mode regulator.

The controller 120 including control circuit elements including hardware, software and/or combinations thereof receives a desired characteristic such as a desired 1.2 volt system bias voltage $V_{system}$ from an internal or external source associated with the microprocessor, and the output voltage $V_{out}$ of the switch-mode regulator. The controller 120 is also coupled to the input voltage $V_{in}$ of the switch-mode regulator and a return lead of the source of electrical power (again, represented by a battery) to provide a ground connection therefor. A decoupling capacitor $C_{dec}$ is coupled to the path from the input voltage $V_{in}$ to the controller 120. The decoupling capacitor $C_{dec}$ is configured to absorb high frequency noise signals associated with the source of electrical power to protect the controller 120.

In accordance with the aforementioned characteristics, the controller 120 provides a signal (e.g., a pulse width modulated signal $S_{PWM}$) to control a duty cycle and a frequency of the main and auxiliary power switches $Q_{mn}$, $Q_{aux}$ of the power train 110 to regulate the output voltage $V_{out}$ thereof. The controller 120 may also provide a complement of the signal (e.g., a complementary pulse width modulated signal $S_{1-PWM}$) in accordance with the aforementioned characteristics. Any controller adapted to control at least one power semiconductor switch of the power converter is well within the broad scope of the present invention. As an example, a controller employing digital circuitry is disclosed in U.S. Pat. No. 7,038,438, entitled "Controller for a Power Converter and a Method of Controlling a Switch Thereof," to Dwarakanath, et al. and U.S. Pat. No. 7,019,505, entitled "Digital Controller for a Power Converter Employing Selectable Phases of a Clock Signal," to Dwarakanath, et al., which are incorporated herein by reference.

The power converter also includes the driver 130 configured to provide drive signals $S_{DRV1}$, $S_{DRV2}$ to the main and auxiliary power switches $Q_{mn}$, $Q_{aux}$, respectively, based on the pulse width modulated signal and the complementary pulse width modulated signal $S_{PWM}$, $S_{1-PWM}$ provided by the controller 120. There are a number of viable alternatives to implement a driver 130 that include techniques to provide sufficient signal delays to prevent crosscurrents when controlling multiple power semiconductor switches in the power converter. The driver 130 typically includes active elements such as switching circuitry incorporating a plurality of driver switches that cooperate to provide the drive signals $S_{DRV1}$, $S_{DRV2}$ to the main and auxiliary power semiconductor switches $Q_{mn}$, $Q_{aux}$. Of course, any driver 130 capable of providing the drive signals $S_{DRV1}$, $S_{DRV2}$ to control a power semiconductor switch is well within the broad scope of the present invention. As an example, a driver is disclosed in U.S. Pat. No. 7,330,017, entitled "Driver for a Power Converter and Method of Driving a Switch Thereof," to Dwarakanath, et al., which is incorporated herein by reference. Also, an embodiment of a semiconductor device that may embody portions of the power conversion circuitry is disclosed in U.S. Pat. No. 7,230,302, entitled "Laterally Diffused Metal Oxide Semiconductor Device and Method of Forming the Same," to Lotfi, et al., which is incorporated herein by reference, and an embodiment of an integrated circuit embodying power conversion circuitry, or portions thereof, is disclosed in U.S. Pat. No. 7,015,544, entitled "Integrated Circuit Employable with a Power Converter," to Lotfi, et al., and U.S. patent application Ser. No. 14/091,739, entitled "Semiconductor Device including Alternating Source and Drain Regions, and Respective Source and Drain Metallic Strips," to Lotfi, et al., which are incorporated herein by reference.

As introduced herein, an integrated circuit such as a field programmable gate array ("FPGA") is formed on a semiconductor die affixed to a surface of a multi-layer substrate such as a multi-layer printed circuit board with a switch-mode regulator formed on the semiconductor die (or another semiconductor die) affixed to the surface of the multi-layer substrate. The integrated circuit and the switch-mode regulator are integrated within a package to form a packaged integrated circuit. The integrated circuit includes circuit elements, ones of which may form at least a portion of the controller and/or driver for the switch-mode regulator. This structure enables higher thermal and efficiency performance characteristics of the integrated circuit compared to one or more linear regulators formed on the same die or within the same package as the integrated circuit. The higher efficiency (e.g., 95 percent) for the switch-mode regulator also reduces waste heat dissipation. An integrated solution is provided with fewer thermal-design challenges and a reduction of the bill-of-material costs at the circuit-board level. In addition, complex power-up sequencing issues for the integrated circuit that otherwise need to be addressed by a circuit-board designer can be eliminated. The result is a scalable integration solution that employs a supply voltage from a switch-mode regulator for operation and can be configured to conform to load requirements of the integrated circuit. A high-efficiency solution employing new techniques to manage interfering voltages in the integrated circuit is beneficial for the packaged integrated circuit design.

In an embodiment, the substrate power plane in the multi-layer substrate is leveraged to route power from a regulated output of the switch-mode regulator to an input of and ultimately circuit elements of the integrated circuit. The use of the power plane reduces the effect of using external line traces that may produce resistive voltage drops and inductive voltage spikes that may cause a bias voltage at a node of the integrated circuit to fall outside a specification value. A larger number of input/output ("I/O") pads of the digital logic can be bonded out due to a reduction in the number of bond pads to supply power to the more-efficiently designed packaged integrated circuit.

Because a switch-mode regulator is employed in lieu of a linear regulator, an input current to the packaged integrated circuit can be lower than its counterpart with the linear dissipative design roughly by a factor of the ratio of the output voltage of the switch-mode regulator to its input voltage (e.g., by a ratio of (1.2 volts)/(3.3 volts)=36 percent). It may be possible to use just one solder ball for a 3.3 volt input rail to the packaged integrated circuit.

An integrated switch-mode regulator formed with an inductor positioned on the multi-layer substrate presents a number of unique design considerations. In an embodiment, the inductor employed with the switch-mode regulator is placed at the periphery of the packaged integrated circuit to reduce the generation of interfering voltages into the circuit elements of the integrated circuit. The inductor is preferably positioned at least one millimeter ("mm") away from the input/output traces or paths of the integrated circuit to achieve reduced magnetic field impact.

Locating an input node of the switch-mode regulator within the packaged integrated circuit introduces a chopped dc current produced by the switch-mode regulator that can corrupt return signals from circuit elements of the integrated circuit that flow in a ground plane. Mitigation of this issue is preferably taken care inside the package by increasing an alternating current ("ac") ground plane impedance. A high-frequency output filter capacitor is positioned and electrically coupled on the multi-layer substrate between an output of the switch-mode regulator and the circuit elements of the integrated circuit to filter fast-edge current components within the packaged integrated circuit. The switch-mode regulator has an input capacitor connected to a ground connection and the output capacitor connected to a separate ground connection. These ground connections are connected at a point near the switch-mode regulator. This is advantageous to increase the ac impedance at this ground connection in the ground plane.

Magnetic fields produced by the inductor can interfere with sensitive, nearby high-speed circuit traces, for instance, low-voltage differential signal input/output traces or for double data rate ("DDR") memory. This may result in increased noise on lines, particularly on surface circuit traces of the multi-layer substrate close to the inductor magnetic-field source. To mitigate these effects, the inductor is placed at a periphery of the packaged integrated circuit to reduce time-varying magnetic-field impacts on sensitive circuit elements such as analog and logic circuits, for example, in a field programmable gate array. The inductor may be positioned outside a practical electromagnetic interfering distance (e.g., one millimeter for a multi-layer type chip inductor) from the circuit traces to the sensitive circuit elements to reduce the interference resulting from a time-varying magnetic field. An electromagnetic interfering distance includes a distance that time-varying voltages induced by the inductor in sensitive circuit elements of an integrated circuit adversely affect an operation thereof.

The sensitive circuit elements of an integrated circuit may be coupled by circuit traces (e.g., input/output traces) on a surface of the multi-layer substrate that are either outside the electromagnetic interfering distance of the inductor or are routed substantially parallel to local magnetic field lines produced by the inductor. Attenuation of interfering voltages greater than, for instance, 40 decibels/millimeter can thereby be achieved. For gapped inductors, a preferred keep-out zone is five times an internal magnetic gap length of the gapped inductor (e.g., 0.5 millimeters) for similar attenuation. With respect to orientation of the magnetic field of the inductor, reduced interference in nearby circuit paths or traces is achieved by orienting the local magnetic field lines of the inductor substantially parallel to nearby sensitive circuit traces coupled to the integrated circuit.

In an embodiment, the circuit traces coupled to the integrated circuit that are within an electromagnetic interfering distance of an inductor are routed substantially parallel to the local magnetic fields lines created by the inductor to reduce voltage-induction effects caused by time-varying magnetic fields produced by the inductor. The circuit traces coupled to the integrated circuit that form a circuit loop near the inductor are formed so that normals to their enclosed areas are aligned substantially perpendicular to the local magnetic field lines created by the inductor.

Figure 2:
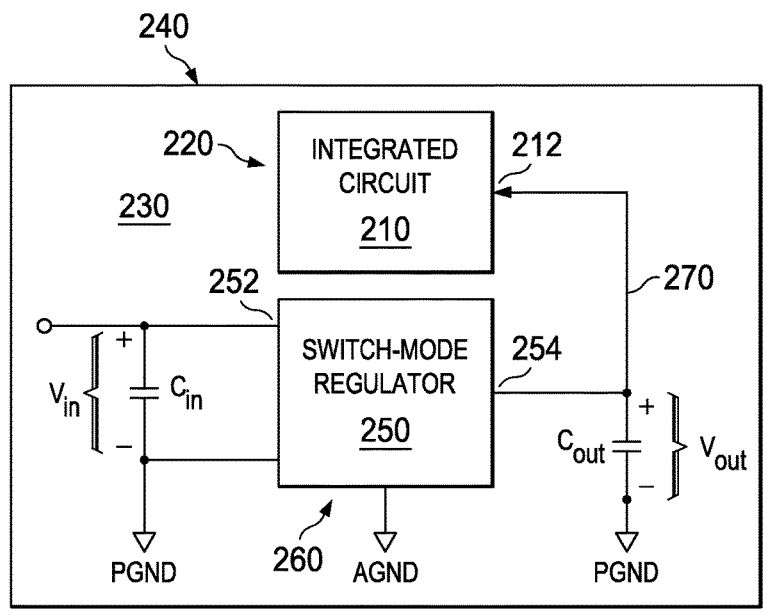
FIG. 2 illustrates a plan view of an embodiment of a packaged integrated circuit.

Turning now to FIG. 2, illustrated is a plan view of an embodiment of a packaged integrated circuit. The packaged integrated circuit includes an integrated circuit 210 formed on a first semiconductor die 220 affixed to a surface 230 of a multi-layer substrate 240. The packaged integrated circuit also includes a switch-mode regulator 250 formed on a second semiconductor die 260 affixed to the surface 230 of the multi-layer substrate 240. The integrated circuit 210 and the switch-mode regulator 250 are then integrated within a package to form the packaged integrated circuit. The packaged integrated circuit receives an input voltage $V_{in}$ (e.g., 3.3 volts ("V") direct current ("dc")) coupled to an input 252 of the switch-mode regulator 250. The switch-mode regulator 250 produces a regulated output voltage $V_{out}$ such as 1.2 V dc at an output 254 thereof that is coupled by circuit traces or paths 270 to an input 212 of the integrated circuit 210. An input capacitor Cin (e.g., 22 microFarads ("μF")) is coupled between the input 252 to the switch-mode regulator 250 and a power ground PGND to reduce a ripple associated with the input voltage $V_{in}$. An output capacitor Cout (e.g., 47 μF) is coupled between the output 254 of the switch-mode regulator 250 and a power ground PGND to reduce a ripple associated with the output voltage $V_{out}$. A separate analog ground AGND for the switch-mode regulator 210 is also illustrated in FIG. 2.

Figure 3:
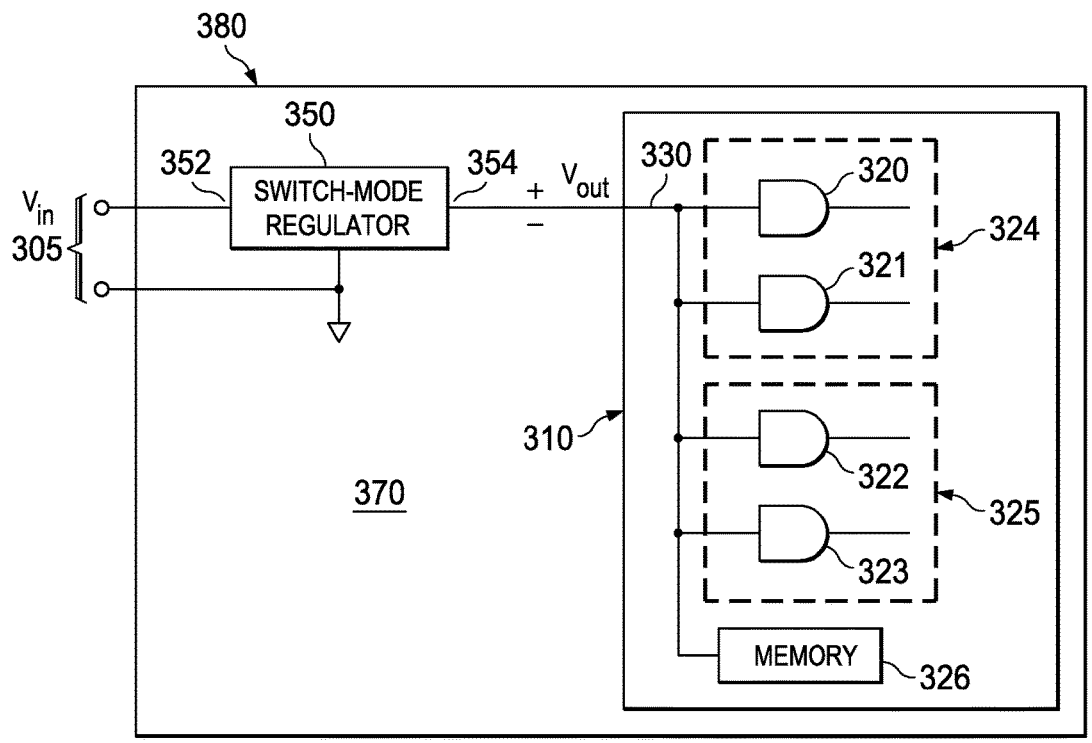
FIG. 3 illustrates a partial schematic diagram of an embodiment of portions of a packaged integrated circuit.

Turning now to FIG. 3, illustrated is a partial schematic diagram of an embodiment of portions of a packaged integrated circuit. A first semiconductor die 310 is formed with first, second, third and fourth circuit elements 320, 321, 322, 323 of an integrated circuit powered by a switch-mode regulator on a second semiconductor die 350. The first and second circuit elements 320, 321 may form at least a portion of a field programmable gate array 324 and the third and fourth circuit elements 320, 321 may form at least a portion of a processor 325. The integrated circuit may also include memory 326 formed from circuit elements.

The processor 325 may execute, among other things, machine-readable instructions or programs to implement the methods and/or processes described herein such as a controller for the switch-mode regulator. The programs stored in the memory 326 may include program instructions or computer program code that, when executed by the processor 325, enable the controller to perform tasks as described herein. The processor 325 may be, include, or be implemented by one or a plurality of processors of various types suitable to the local application environment, and may include or operate with one or more of general-purpose computers, special purpose computers, microprocessors, digital signal processors, field programmable gate arrays, application-specific integrated circuits, and processors based on a multi-core processor architecture, as non-limiting examples. Of course, other processors from other families are also appropriate. The memory 326 may be, include, or be implemented by random access memory, static random access memory, synchronous dynamic random access memory, RAMBUS dynamic random access memory and/or other types of random access memory devices. The memory 326 may also be, include, or be implemented by read only memory, flash memory and/or other types of memory devices.

A regulated output voltage Vout such as 1.2 V dc at an output 354 of the switch-mode regulator 350 is supplied to the circuit elements 320, 321, 322, 323 over an output voltage bus 330 embodied in circuit traces in a multi-layer substrate 380. An input voltage Vin such as 3.3 V dc at the input 305 of the packaged integrated circuit also provides an input voltage Vin at an input 352 to the switch-mode regulator. As opposed to employing a linear voltage regulator with low drop-out voltages for power conversion and regulation, the switch-mode regulator presents a relatively minor source of heat for the packaged integrated circuit. The first and second semiconductor die 310, 350 are affixed to a surface 370 of the multi-layer substrate 380. As described herein, the integrated circuit and switch-mode regulator may also be formed on a semiconductor die.

Figure 4:
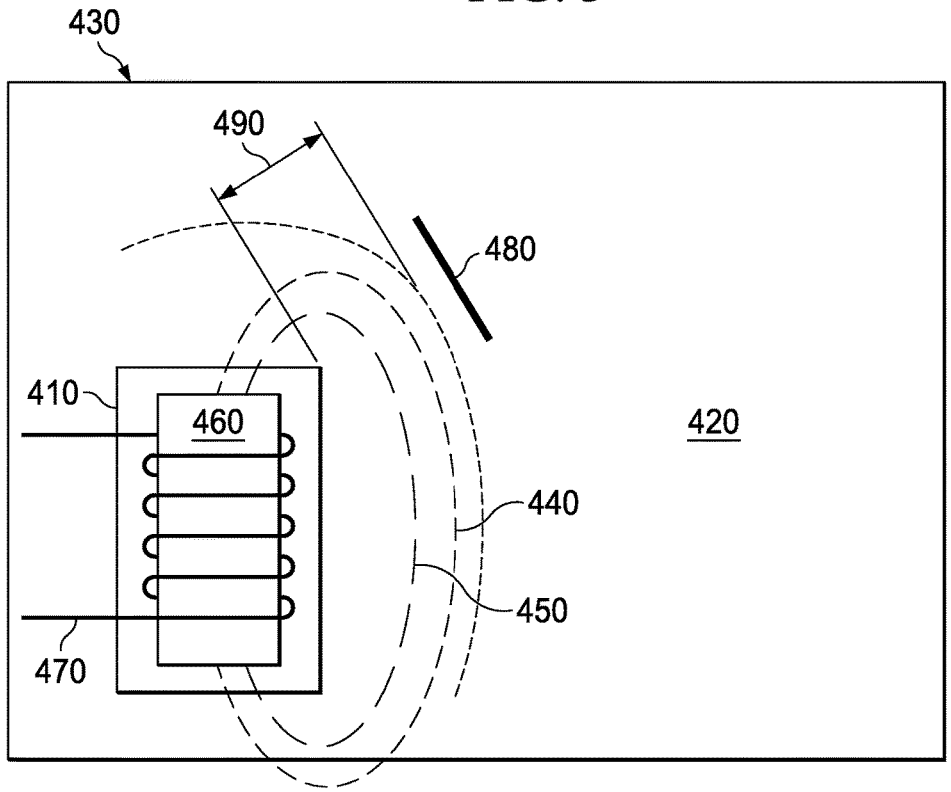
FIG. 4 illustrates a plan view of an embodiment of portions of a packaged integrated circuit.

Turning now to FIG. 4, illustrated is a plan view of an embodiment of portions of a packaged integrated circuit. The packaged integrated circuit includes an inductor 410 positioned on and bonded to a surface 420 of a multi-layer substrate 430 and electrically coupled to a circuit node of a semiconductor die including a switch-mode regulator (see, e.g., FIG. 2). The inductor 410 produces an external magnetic field illustrated by local magnetic field lines 440, 450. The inductor 410 is formed with a magnetic core 460 surrounded by windings such as conductive winding 470. The inductor 410 is positioned at a periphery of the multi-layer substrate 430. Circuit traces or paths 480 coupled to an integrated circuit (see, e.g., FIG. 2) are routed substantially parallel to the local magnetic field lines 440, 450 produced by the inductor 410 and are generally relatively undisturbed by time-varying magnetic fields produced by the inductor 410. As further protection against electromagnetic disturbance, the circuit trace 480 is separated by more than an electromagnetic interfering distance 490 from the inductor 410.

The process of orienting the circuit trace 480 (or portion thereof) substantially parallel to the local magnetic field lines 440, 450 to reduce a disturbing voltage relies on Maxwell's equations that describe an induced voltage in a circuit proportional to an area of the circuit that is intersected by a time varying magnetic field. To facilitate a design, the magnitude and direction of the local magnetic field lines 440, 450 produced by the inductor 410 can be mapped in a laboratory, as is well known in the art, with a probe formed with a small conductive loop coupled to an input terminal of a voltage-sensing device such as an oscilloscope, while exciting the inductor 410 with a time-varying voltage.

Thus, to reduce voltage-induction effects caused by time-varying magnetic fields produced by the inductor, circuit traces in the packaged integrated circuit that are near the inductor are routed substantially parallel to the inductor's local magnetic field lines. Circuit loops in the integrated circuit near the inductor are formed so that their normals to their enclosed areas are substantially perpendicular to the inductor's local magnetic field lines.

Figure 5:
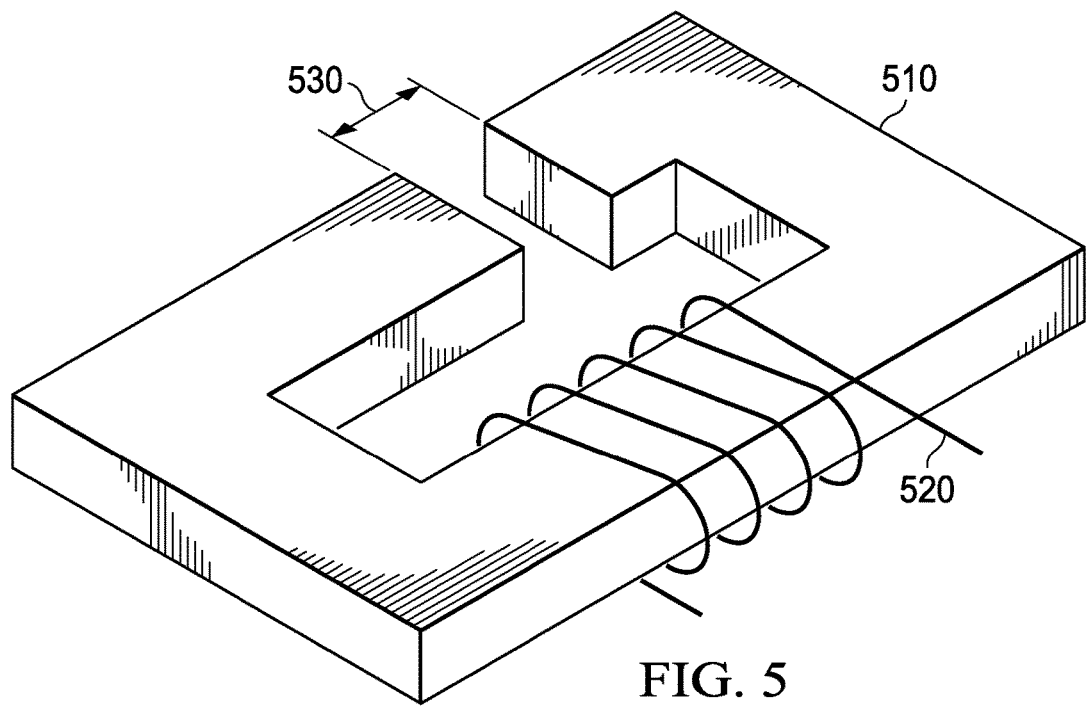
FIGS. 5 and 6 illustrate three-dimensional views of embodiments of an inductor.
Figure 6:
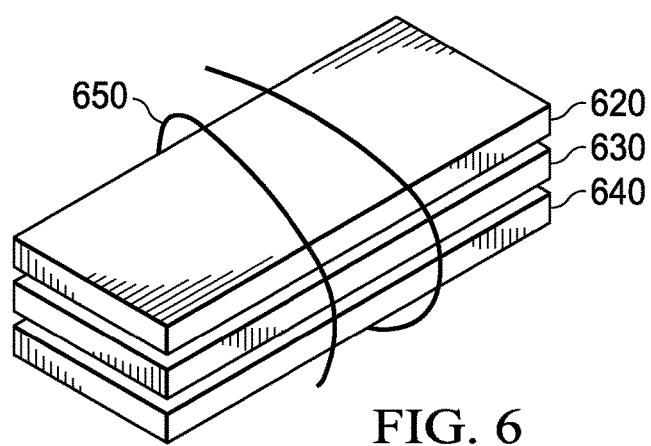

Turning now to FIGS. 5 and 6, illustrated are three-dimensional views of embodiments of an inductor. The inductor of FIG. 5 includes a magnetic core 510, such as a soft ferrite core, with a magnetic permeability substantially higher than that of a vacuum. The magnetic core 510 is formed with a core gap 530. A winding or an electrically conductive winding 520 is wrapped around and insulated from the magnetic core 510. The core gap 530 forms a portion of the magnetic path of the inductor through which a substantial portion of its magnetic field flows and has substantially lower magnetic permeability than the magnetic core 510. For an inductor formed with a core gap 530, an electromagnetic interfering distance for adjacent circuit traces is generally about five times a length of the magnetic core gap 530. The magnetic core gap 530 can produce a substantial magnetic field external to the inductor.

FIG. 6 illustrates a multi-layer inductor formed with a magnetic core having magnetic layers 620, 630, 640 each having a magnetic permeability substantially higher than that of a vacuum. The magnetic permeability of the soft ferrite can be ten times or more higher than that of a vacuum. The magnetic layers 620, 630, 640 are generally separated by insulating layers to reduce conductivity of paths for currents induced therein. The magnetic layers 620, 630, 640 are surrounded by a winding or an electrically conductive winding 650 that is wrapped around and insulated from the magnetic layers 620, 630, 640. For a multi-layer inductor that may be suitable for use with a switch-mode regulator as introduced herein, an electromagnetic interfering distance is, without limitation, about one millimeter.

Figure 7:
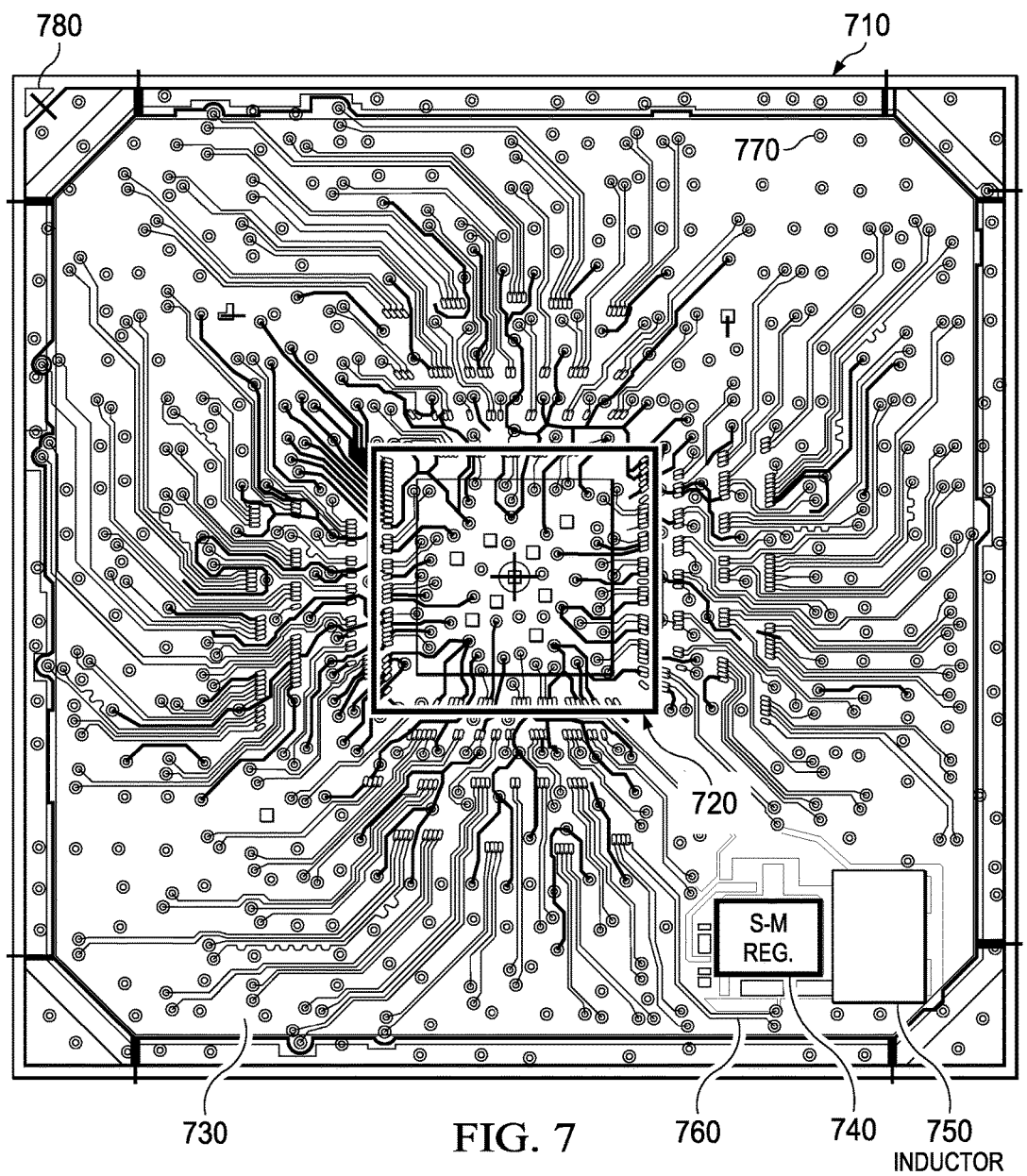
FIG. 7 illustrates a plan view of an embodiment of packaged integrated circuit.

Turning now to FIG. 7, illustrated is a plan view of an embodiment of packaged integrated circuit. The integrated circuit on the first semiconductor die 720 is powered by a switch-mode regulator formed on a second semiconductor die 740 that is also affixed to a surface 730 of a multi-layer substrate 710. The switch-mode regulator is formed with an inductor 750 positioned at a periphery of the multi-layer substrate 710. A circuit trace 760 such as a logic input/output trace on the surface 730 of the multi-layer substrate 710 near the inductor 750 and coupled to the integrated circuit on the first semiconductor die 720 is routed substantially parallel to external magnetic field lines of the magnetic field produced by the inductor 750. The circuit trace 760 is oriented so that an associated circuit loop near the inductor 750 created by the circuit trace 760 is formed with its normal to its enclosed area being substantially perpendicular to the local magnetic field lines of the inductor 750. This reduces (e.g., minimizes) a voltage induced into the circuit trace 760 by time-varying local magnetic field lines of the inductor 750.

As described herein, it is understood that time-varying magnetic field lines distant from the inductor 750 (substantially outside an electromagnetic interfering distance) produce less disturbance in circuit loops than time-varying local magnetic field lines near the inductor 750. Vias, such as via 770, are employed to couple circuit traces on the surface 730 of the multi-layer substrate 710 to circuit traces on an opposing surface of the multi-layer substrate 710 or to a ground plane 780 that may be formed on the opposing surface of the multi-layer substrate 710 and insulated from conductive circuit traces that lie thereabove. A small portion of a ground plane 780 is illustrated in the top left corner of the multi-layer substrate 710.

Figure 8:
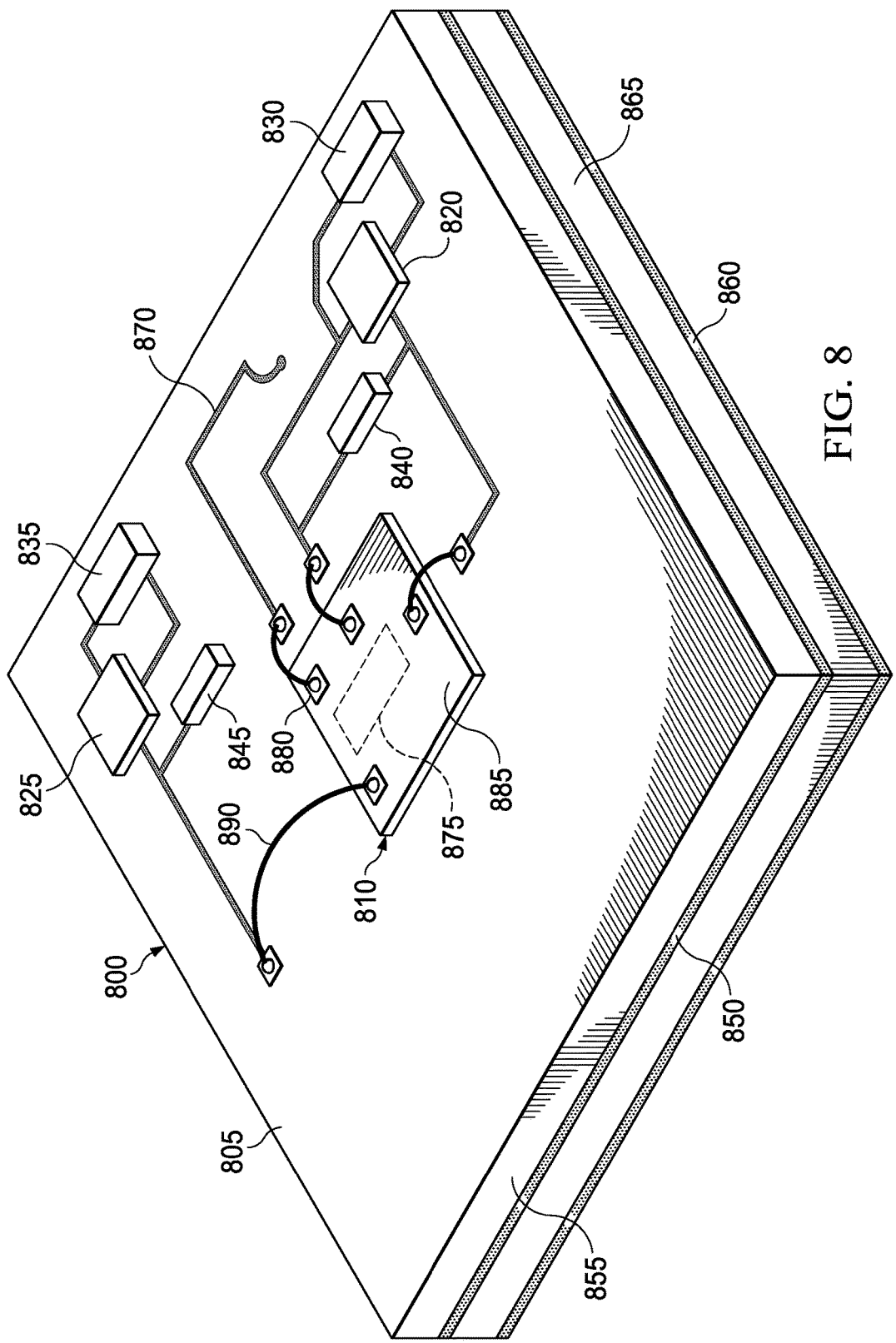
FIGS. 8 and 9 illustrate three-dimensional views of embodiments of a packaged integrated circuit.

Turning now to FIG. 8, illustrated is a three-dimensional view of an embodiment of a packaged integrated circuit. The packaged integrated circuit is formed on a multi-layer substrate 800 formed with conductive layers 850, 860 separated by insulating layers 855, 865. One of the conductive layers (such as conductive layer 850) may form a ground plane for the packaged integrated circuit. Conductive circuit traces such as conductive circuit trace 870 are routed on an upper surface 805 of the multi-layer substrate 800. An integrated circuit such as a field programmable gate array formed on a first semiconductor die 810 is affixed to the upper surface 805 of the multi-layer substrate 800. A switch-mode regulator formed at least in part on a second semiconductor die 820 is affixed to the upper surface 805 of the multi-layer substrate 800. An inductor 830 on the upper surface 805 of the multi-layer substrate 800 is coupled to the second semiconductor die 820. A capacitor 840 is coupled to an output of the switch-mode regulator on the second semiconductor die 820 to filter high-frequency voltage harmonics produced by the switch-mode regulator. A regulated output voltage of the switch-mode regulator is coupled to an input such as a bias voltage input of the integrated circuit residing on the first semiconductor die 810.

The conductive circuit trace 870 that may be routed within an electromagnetic interfering distance of the inductor 830 is oriented substantially parallel to local magnetic field lines of the magnetic field produced by the inductor 830. The conductive circuit trace 870 is coupled to circuit elements 875 of the integrated circuit and a portion of the conductive circuit trace 870 (within the electromagnetic interfering distance) is routed such that a normal to an area enclosed by the conductive circuit trace 870 and a ground plane (such as the conductive layer 850) of the multi-layer substrate 800 positioned under the conductive circuit trace 870 is aligned substantially perpendicular to the local magnetic field lines of the magnetic field produced by the inductor 830. Remaining portions of the conductive circuit trace 870 that lie within the electromagnetic interfering distance of the inductor 830 are routed on one or more internal conductive layers of the multi-layer substrate 800, and can be shielded by overlying conductive layers of the multi-layer substrate 800 such as the conductive layer functional as a ground plane.

Another switch-mode regulator is formed in part on a third semiconductor die 825 affixed to the upper surface 805 of the multi-layer substrate 800. A regulated output voltage of the another switch-mode regulator is also coupled to an input such as a bias voltage input of the integrated circuit residing on the first semiconductor die 810. An inductor 835 on the upper surface 805 of the multi-layer substrate 800 is coupled to the third semiconductor die 825. Another capacitor 845 is coupled to an output of the another switch-mode regulator on the third semiconductor die 825 to filter high-frequency harmonics produced by the another switch-mode regulator. Pads on a surface of the semiconductor dice (such as a pad 880 on an upper surface 885 of the first semiconductor die 810) can be coupled to circuit traces such as circuit trace 870 on the upper surface 805 of the multi-layer substrate 800 by wire bonds such as wire bond 890 or by solder bumps on a lower surface of the first semiconductor die 810. Ones of the circuit elements 875 of the integrated circuit on the first semiconductor die 810 may form at least a portion of a controller for the switch-mode regulator and/or the another switch-mode regulator. Of course, the controller(s) may also be formed on either the second or third semiconductor die 820, 825. Additionally, the another switch-mode regulator may be formed on the second semiconductor die 820 as opposed to the third semiconductor die 825. The circuit elements 875 may be hardwired and/or execute program code on a processor formed thereby to control the switch-mode regulator and/or the another switch-mode regulator or perform other tasks intended for the integrated circuit.

Thus, a circuit trace from the regulated output of the switch-mode regulator runs in the multi-layer substrate, is electrically coupled to a bonding point to the first semiconductor die, and is routed up into the first semiconductor die through a wire bond (or, alternatively, a solder bump). No intervening linear regulator is necessary to regulate an input voltage to circuit elements of the integrated circuit on the first semiconductor die. In conventional art wherein the first semiconductor die and the switch-mode regulator that feeds it are separated, a linear regulator is necessary to be inserted in the path that includes the wire bond (or solder bump) and a power input node of the circuit elements of the integrated circuit.

Figure 9:
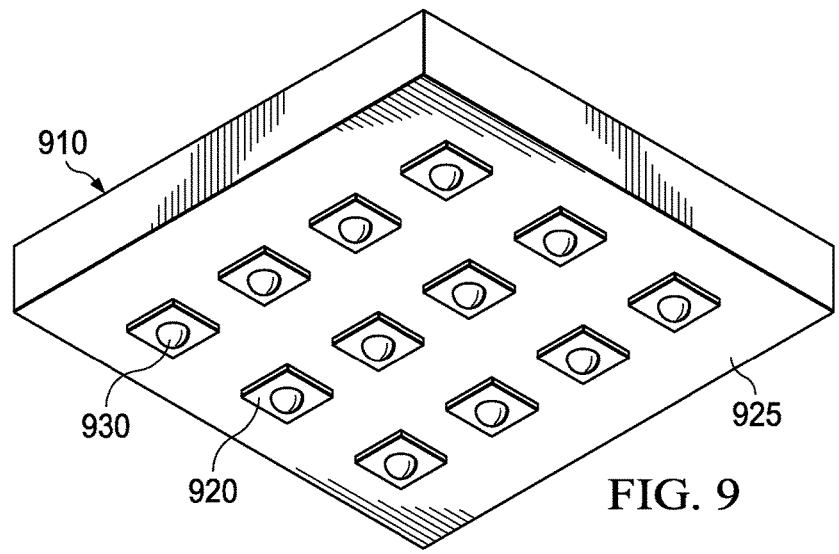

Turning now to FIG. 9, illustrated is a three-dimensional view of an embodiment of a packaged integrated circuit. The packaged integrated circuit is encapsulated with an encapsulant 910 such as epoxy. An integrated circuit and switch-mode regulator of the packaged integrated circuit are not visible due to presence of the encapsulant 910. The packaged integrated circuit is formed with external input/output pads such as external input/output pad 920 on a lower surface 925 thereof. Solder balls such as solder ball 930 are formed on exposed surfaces of the external input/output pads 920 to form a "ball-grid array" to enable the packaged integrated circuit to be reflow-attached to an end product circuit board after being positioned thereon by a pick-and-place assembly machine. After being suitably heated in a reflow oven, the solder balls 930 melt and the packaged integrated circuit becomes reliably electrically coupled to circuit traces on the end product circuit board. Because the packaged integrated circuit is constructed with a power-efficient switch-mode regulator, thermal design issues for the designer of the end product circuit board are substantially ameliorated.

Figure 10:
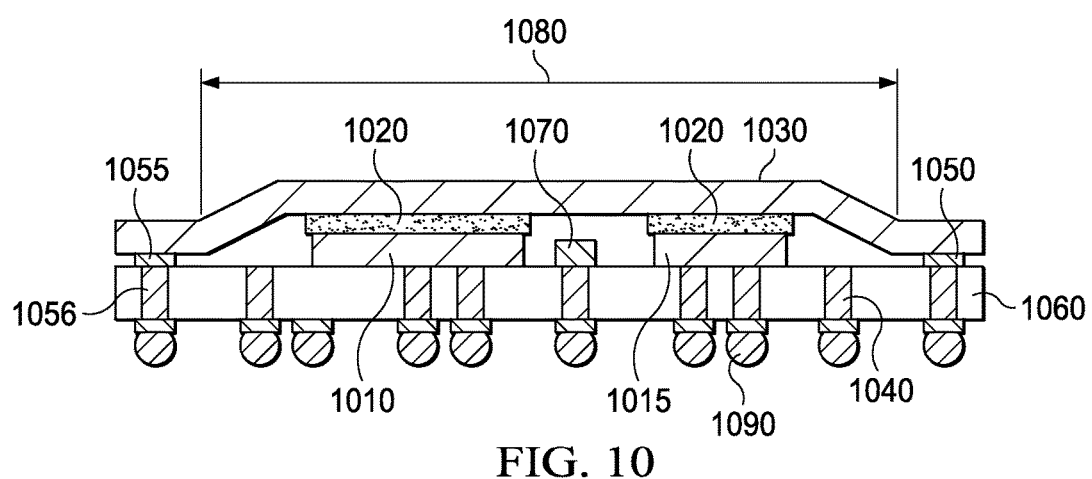
FIG. 10 illustrates an elevational view of an embodiment of a packaged integrated circuit.

Turning now to FIG. 10, illustrated is an elevational view of an embodiment of a packaged integrated circuit formed with cover such as an overlying lid 1030. The overlying lid 1030 may be formed with an elevated portion 1080 in a central region thereof as indicated in FIG. 10 to accommodate integrated circuits and switch-mode regulators (at least one semiconductor die) under it. The packaged integrated circuit includes a substrate 1060, such as, without limitation, a printed-wiring board substrate formed with FR-4 or another insulating material. In an embodiment, the substrate 1060 is a multi-layer substrate. The packaged integrated circuit includes a first semiconductor die 1010 with an integrated circuit including circuit elements formed thereon. The packaged integrated circuit includes a second semiconductor die 1015 with a switch-mode regulator formed thereon. The first and second semiconductor die 1010, 1015 are flip-chip solder attached to lands and vias on an upper surface of the substrate 1060. The first and second semiconductor die 1010, 1015 may also be attached to lands and vias on the upper surface of the substrate 1060 by wire bonds.

The overlying lid 1030 can be formed with copper, aluminum, or steel and can be protected with a thin overlying metallic layer (not shown) to facilitate soldering to lands on the upper surface of the substrate 1060. In addition, a thin adhesive layer 1020 is applied to an upper surface of the first and second semiconductor die 1010, 1015 that contacts the overlying lid 1030 to provide a thermal path to transfer heat from the integrated circuit and/or switch-mode regulator to the overlying lid 1030. Vias, such as via 1040, provide a path to electrically and thermally couple traces on the upper surface of the substrate 1060 to traces and pads on a lower surface thereof. The substrate 1060 accommodates surface-mount components 1070 on the upper surface thereof such as, without limitation, a surface-mount resistor, diode, inductor or capacitor. The substrate 1060 is formed with pads 1050, 1055 on an upper surface thereof that provide in conjunction with an underlying via, such as via 1056, a thermal path from the overlying lid 1030 to a printed-wiring board (not shown) that may be electrically coupled to pads on the lower surface thereof. The substrate 1060 may be coupled to the printed-wiring board by a reflow soldering process that can employ, for example solder balls such as solder ball 1090.

Thus, the overlying lid 1030 is positioned over and thermally coupled to the first semiconductor die 1010, the second semiconductor die 1015 and the substrate 1060. While two semiconductor dice are illustrated in FIG. 10, it should be understood that the packaged integrated circuit may include any number of semiconductor dice including a single semiconductor die.

Figure 11:
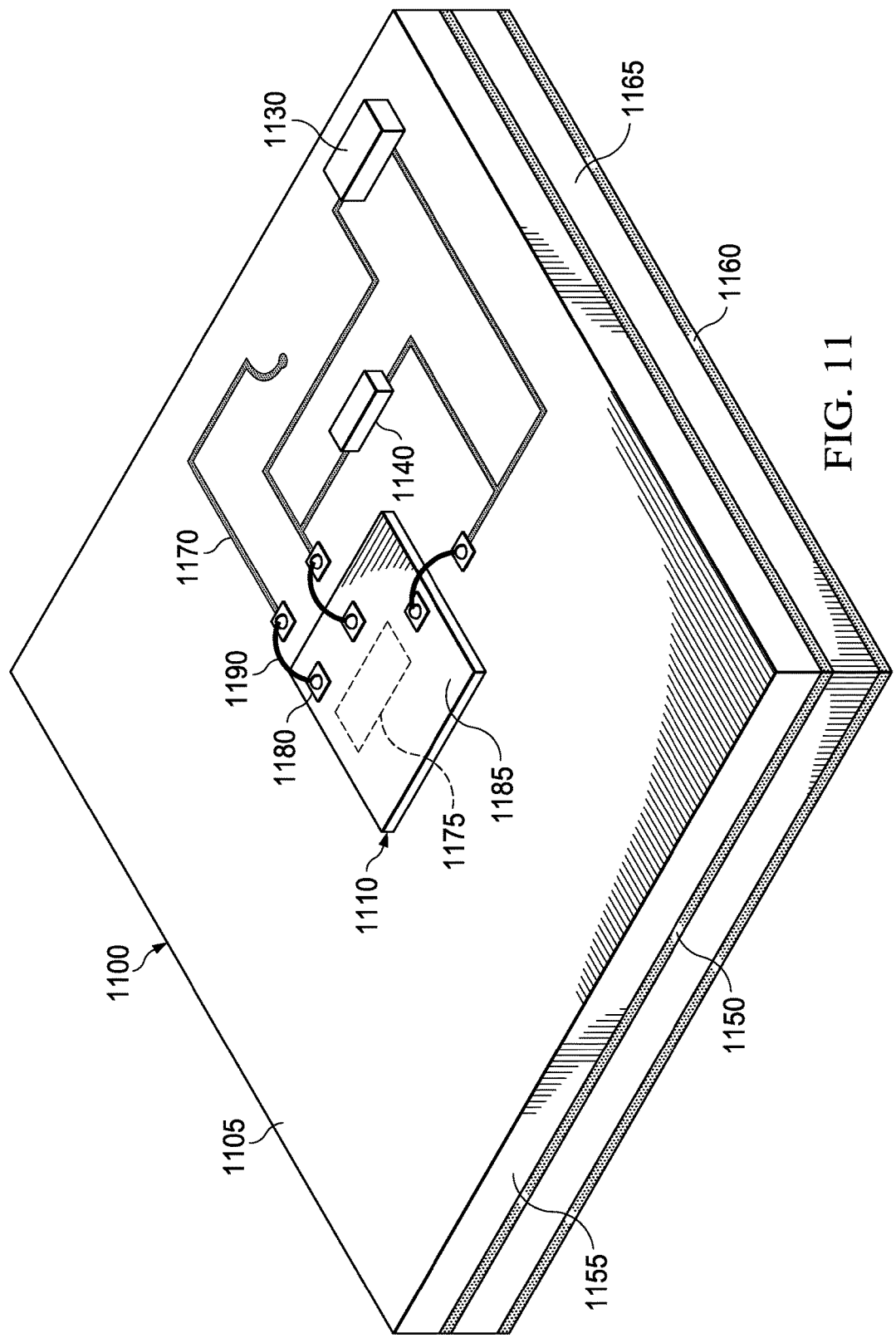
FIG. 11 illustrates a three-dimensional view of an embodiment of a packaged integrated circuit.

Turning now to FIG. 11, illustrated is a three-dimensional view of an embodiment of a packaged integrated circuit. In the example illustrated in FIG. 11, an integrated circuit such as a field programmable gate array and a switch-mode regulator are formed on a semiconductor die 1110. A controller for switch-mode regulator may incorporate circuit elements 1175 from the integrated circuit and/or employ distinct circuit elements from the integrated circuit, or a combination thereof. A regulated output voltage of the switch-mode regulator is coupled to an input such as a bias voltage input of the integrated circuit residing on the semiconductor die 810.

The packaged integrated circuit is formed on a multi-layer substrate 1100 formed with conductive layers 1150, 1160 separated by insulating layers 1155, 1165. One of the conductive layers (such as conductive layer 1150) may form a ground plane for the packaged integrated circuit. Conductive circuit traces such as conductive circuit trace 1170 are routed on an upper surface 1105 of the multi-layer substrate 1100. The semiconductor die 1110 is affixed to the upper surface 1105 of the multi-layer substrate 1100. An inductor 1130 on the upper surface 1105 of the multi-layer substrate 1100 is coupled to the semiconductor die 1110. A capacitor 1140 is coupled to an output of the switch-mode regulator on the semiconductor die 1110 to filter high-frequency voltage harmonics produced by the switch-mode regulator.

The conductive circuit trace 1170 that may be routed within an electromagnetic interfering distance of the inductor 1130 is oriented substantially parallel to local magnetic field lines of the magnetic field produced by the inductor 1130. The conductive circuit trace 1170 is coupled to circuit elements 1175 of the integrated circuit and a portion of the conductive circuit trace 1170 (within the electromagnetic interfering distance) is routed such that a normal to an area enclosed by the conductive circuit trace 1170 and a ground plane (such as the conductive layer 1150) of the multi-layer substrate 1100 positioned under the conductive circuit trace 1170 is aligned substantially perpendicular to the local magnetic field lines of the magnetic field produced by the inductor 1130. Remaining portions of the conductive circuit trace 1170 that lie within the electromagnetic interfering distance of the inductor 1130 are routed on one or more internal conductive layers of the multi-layer substrate 1100, and can be shielded by overlying conductive layers of the multi-layer substrate 1100 such as the conductive layer functional as a ground plane. Pads on a surface of the semiconductor die 1110 (such as a pad 1180 on an upper surface 1185 of the semiconductor die 1110) can be coupled to circuit traces such as circuit trace 1170 on the upper surface 1105 of the multi-layer substrate 1100 by wire bonds such as wire bond 1190 or by solder bumps on a lower surface of the semiconductor die 1110.

Thus, the main and auxiliary power switches $Q_{mn}$, $Q_{aux}$ of the switch-mode regulator illustrated and described hereinabove with reference to FIG. 1 may be formed on the same semiconductor die as the integrated circuit. As described in U.S. Pat. No. 7,330,017, entitled "Driver for a Power Converter and Method of Driving a Switch Thereof," to Dwarakanath, et al., previously referenced and incorporated above, a gate driver for the main and auxiliary power switches $Q_{mn}$, $Q_{aux}$ referenced to a voltage level may include switching circuitry referenced to another voltage level and subject to a control voltage limit can be constructed with low-voltage circuit elements on a common die. Such technique can be employed to drive a power switch of a switch-mode regulator with low-voltage circuit elements.

Thus, the packaged integrated circuit includes a multi-layer substrate, and an integrated circuit (e.g., a digital integrated circuit, a processor, a field programmable gate array, etc.) and a switch-mode regulator formed on a semiconductor die affixed to a surface of the multi-layer substrate. An output of the switch-mode regulator is coupled to an input of the integrated circuit and ultimately to circuit elements of the integrated circuit by, for instance, circuit traces of the multi-layer substrate. The circuit elements may form at least one of logic circuits, memory, an analog-to-digital converter, and a phase-locked loop. The multi-layer substrate may include circuit traces formed on conductive substrate layers separated by insulating layers and electrically coupled by vias formed between the conductive substrate layers, and a ball-grid array formed on an opposing surface to the surface. The semiconductor die is electrically coupled to circuit traces on the surface of the multi-layer substrate by wire bonds or by solder bumps in a flip-chip arrangement. The switch-mode regulator includes a controller formed on the semiconductor die and circuit elements of the integrated circuit may form at least a portion of the controller.

The switch-mode regulator also includes a capacitor and an inductor each positioned on and bonded to the surface of the multi-layer substrate and electrically coupled to the semiconductor die. The inductor is positioned at a periphery of the multi-layer substrate and oriented so that a local magnetic field line of a magnetic field created by the inductor is substantially parallel to a portion of a circuit trace routed within an electromagnetic interfering distance of the inductor. The electromagnetic interfering distance is about one millimeter for a multi-layer type chip inductor formed on the multi-layer substrate. The inductor may be formed with a magnetic core having a core gap with substantially lower magnetic permeability than the magnetic core and the electromagnetic interfering distance is five times a length of the core gap. The multi-layer substrate may be formed with a ground plane under and insulated from the circuit trace. The circuit trace is coupled to a circuit element of the integrated circuit and the portion of the circuit trace is routed such that a normal to an area enclosed by the circuit trace and a ground plane of the multi-layer substrate is aligned substantially perpendicular to the local magnetic field line of the magnetic field produced by the inductor.

The multi-layer substrate may include conductive layers separated by insulating layers, one conductive layer of the conductive layers includes a ground plane, and solder pads for a ball-grid array formed on an opposing surface to the surface. The packaged integrated circuit may further include another switch-mode regulator formed on the semiconductor die or another semiconductor die affixed to the surface of the multi-layer substrate. The integrated circuit and the switch-mode regulator(s) are encapsulated in epoxy to form the packaged integrated circuit. Alternatively, a cover (e.g., including an elevated portion) may be positioned over and thermally coupled to the semiconductor die and the multi-layer substrate.

Figure 12:
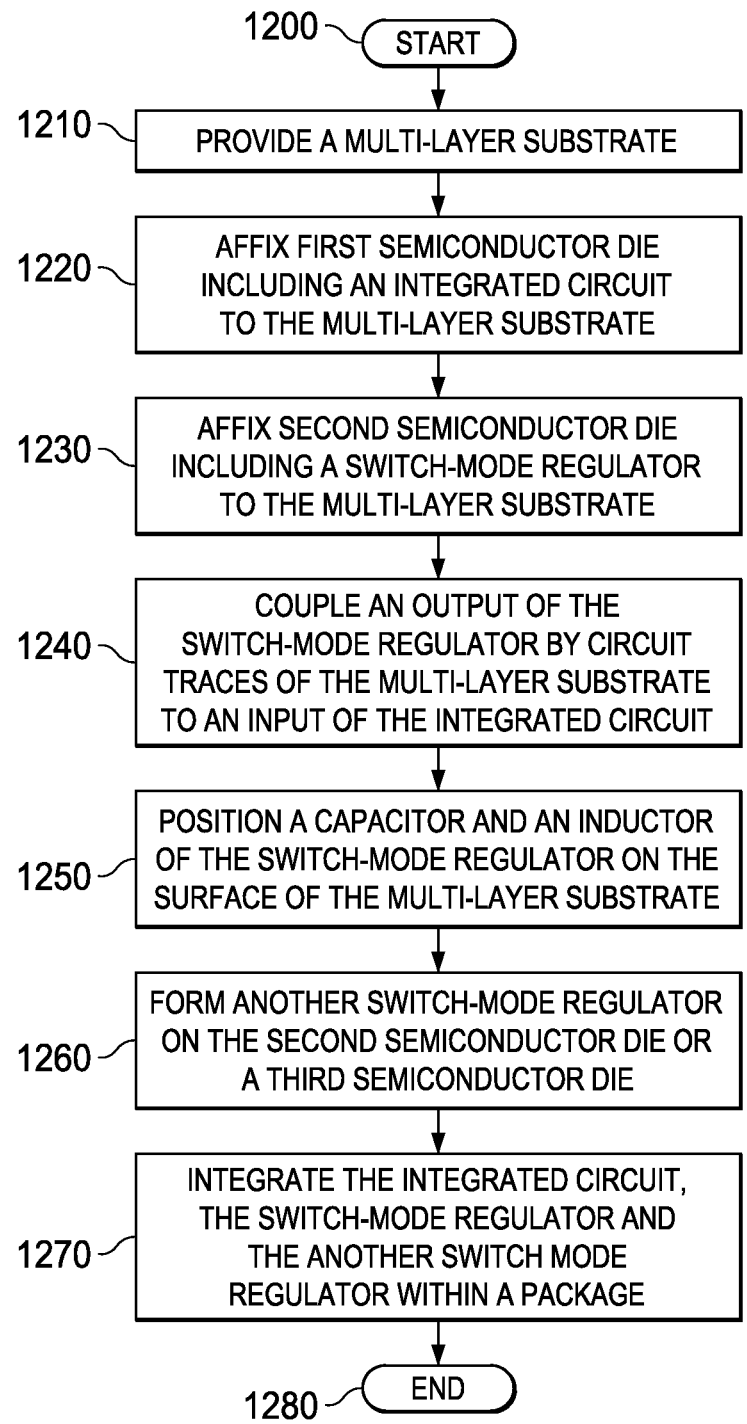
FIG. 12 illustrates a flow diagram of an embodiment of a method of forming a packaged integrated circuit.

Turning now to FIG. 12, illustrated is a flow diagram of an embodiment of a method of forming a packaged integrated circuit. The method begins in a start step or module 1200. At a step or module 1210, the method continues by providing a multi-layer substrate. An integrated circuit (e.g., a digital integrated circuit) formed on a first semiconductor die is affixed to a surface of the multi-layer substrate at a step or module 1220. At a step or module 1230, a switch-mode regulator (e.g., employing a buck converter topology including, for instance, a power switch and a controller) formed on a second semiconductor die is affixed to the surface of the multi-layer substrate. The first semiconductor die and the second semiconductor die may be electrically coupled to circuit traces on the surface of the multi-layer substrate by wire bonds or by solder bumps in a flip-chip arrangement. At a step or module 1240, an output of the switch-mode regulator is coupled by circuit traces of the multi-layer substrate to an input of the integrated circuit. The output of the switch-mode regulator may be coupled (e.g., directly coupled) to circuit elements (e.g., logic circuits, memory, an analog-to-digital converter, and a phase-locked loop) of the integrated circuit.

At a step or module 1250, a capacitor and an inductor of the switch-mode regulator are each positioned on and bonded to the surface of the multi-layer substrate and electrically coupled to a circuit node of the second semiconductor die. The inductor may be positioned at a periphery of the multi-layer substrate and oriented so that a local magnetic field line of a magnetic field created by the inductor is substantially parallel to a portion of a circuit trace routed within an electromagnetic interfering distance of the inductor. The circuit trace may be coupled to a circuit element of the integrated circuit and the portion of the circuit trace is routed such that a normal to an area enclosed by the circuit trace and a ground plane of the multi-layer substrate positioned under the circuit trace is aligned substantially perpendicular to the local magnetic field line of the magnetic field produced by the inductor. The electromagnetic interfering distance may be one millimeter ("mm") for a multi-layer type chip inductor formed on the multi-layer substrate. The inductor may be formed with a magnetic core having a core gap with substantially lower magnetic permeability than the magnetic core and the electromagnetic interfering distance is five times a length of the core gap.

At a step or module 1260, another switch-mode regulator formed on the second semiconductor die or a third semiconductor die (affixed to the surface of the multi-layer substrate). The integrated circuit (e.g., a field programmable gate array) on the first semiconductor die, the switch-mode regulator on the second semiconductor die and the another switch-mode regulator on the second semiconductor die or third semiconductor die are integrated within a package (e.g., encapsulated with an epoxy or covered with a lid) to form the packaged integrated circuit at a step or module 1270. In an embodiment, the multi-layer substrate includes circuit traces formed on conductive substrate layers separated by insulating layers and electrically coupled by vias formed between the conductive substrate layers, and a ball-grid array formed on an opposing surface to the surface. One of the conductive layers may include a ground plane, and solder pads for the ball-grid array are formed on the opposing surface to the surface. The method ends at step or module 1280. While the method above incorporates multiple semiconductor dice therein, it should be understood that the integrated circuit and switch-mode regulator(s) may be formed on a semiconductor die. Also, the controller for the switch-mode regulators may be located on the first, second or third semiconductor die, or a combination thereof. In other words, circuit elements of the integrated circuit may form at least a portion of the controller for the switch-mode regulators.

Thus, a packaged integrated circuit has been described herein. In one embodiment, the packaged integrated circuit includes a multi-layer substrate and an integrated circuit formed on a first semiconductor die affixed to a surface of the multi-layer substrate. The packaged integrated circuit also includes a switch-mode regulator formed on a second semiconductor die affixed to the surface of the multi-layer substrate. The integrated circuit and the switch-mode regulator are integrated within a package to form the packaged integrated circuit. A controller for the switch-mode regulator may be located on the first or second semiconductor die, or a combination thereof. In accordance therewith, at least one circuit element of the integrated circuit may form a portion of the controller for the switch-mode regulator. In a related, but alternative embodiment, the integrated circuit and the switch-mode regulator are formed on a semiconductor die.

Again, at least one circuit element of the integrated circuit may form a portion of the controller for the switch-mode regulator.

Those skilled in the art should understand that the previously described embodiments of a packaged integrated circuit and related methods of constructing the same are submitted for illustrative purposes only. In addition, other embodiments capable of integrating a switch-mode regulator or power converter with an integrated circuit are well within the broad scope of the present invention. The integrated circuit and controller (and other circuits or circuit elements) may be implemented in accordance with hardware (embodied in one or more chips), or may be implemented as software or firmware for execution by a processor. In particular, in the case of firmware or software, the integrated circuit and controller may include and/or be provided as a computer program product including a computer readable medium or storage structure (e.g., non-transitory computer readable medium) embodying computer program code (i.e., software or firmware) thereon for execution by a processor.

For a better understanding of integrated circuits, semiconductor devices and methods of manufacture therefor see "Semiconductor Device Fundamentals," by R. F. Pierret, Addison-Wesley (1996), and "Handbook of Sputter Deposition Technology," by K. Wasa and S. Hayakawa, Noyes Publications (1992). For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht, and G. C. Verghese, Addison-Wesley (1991). The aforementioned references are incorporated herein by reference in their entirety.

Also, although the present invention and its advantages have been described in detail, it should be understood that various changes, substitutions, and alterations can be made herein without departing from the spirit and scope of the invention as defined by claims on embodiments. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, claims on embodiments are intended to include within their scope such processes, machines, manufacture, compositions of matter, means, methods, or steps.

What is claimed is:

1. A packaged integrated circuit, comprising:
a multi-layer substrate;
an integrated circuit formed on a first semiconductor die affixed to a surface of said multi-layer substrate; and
a switch-mode regulator formed on a second semiconductor die affixed to said surface of said multi-layer substrate, wherein said switch-mode regulator comprises an inductor, and wherein said inductor is oriented such that a local magnetic field line of a magnetic field created by said inductor is substantially parallel to a portion of circuit traces of said multi-layer substrate routed within an electromagnetic interfering distance of said inductor, wherein said portion of said circuit traces is configured to substantially follow an orientation of said local magnetic field line within said electromagnetic interfering distance, and wherein an output of said switch-mode regulator is electrically coupled by said circuit traces to circuit elements of said integrated circuit.

2. The packaged integrated circuit as recited in claim 1, wherein said circuit elements comprise one or more of logic circuits, a memory, an analog-to-digital converter, a phase-locked loop, or any combination thereof.

3. The packaged integrated circuit as recited in claim 1, wherein said multi-layer substrate comprises said circuit traces formed on conductive substrate layers separated by insulating layers and electrically coupled by vias formed between said conductive substrate layers, and a ball-grid array formed on an opposing surface to said surface.

4. The packaged integrated circuit as recited in claim 1, wherein said integrated circuit comprises a digital integrated circuit.

5. The packaged integrated circuit as recited in claim 1, wherein said output of said switch-mode regulator is coupled by said circuit traces to an input of said integrated circuit.

6. The packaged integrated circuit as recited in claim 1, wherein said first semiconductor die and said second semiconductor die are electrically coupled to said circuit traces on said surface of said multi-layer substrate by wire bonds or by solder bumps in a flip-chip arrangement.

7. The packaged integrated circuit as recited in claim 1, wherein said switch-mode regulator comprises a controller formed on said first semiconductor die, said second semiconductor die, or both.

8. The packaged integrated circuit as recited in claim 1, wherein said switch-mode regulator comprises a capacitor, and wherein said capacitor and said inductor are each positioned on and bonded to said surface of said multi-layer substrate and electrically coupled to said second semiconductor die.

9. The packaged integrated circuit as recited in claim 8, wherein said inductor is positioned at a periphery of said multi-layer substrate.

10. The packaged integrated circuit as recited in claim 1, wherein said electromagnetic interfering distance is one millimeter for a multi-layer type chip inductor formed on said multi-layer substrate.

11. The packaged integrated circuit as recited in claim 1, wherein said inductor is formed with a magnetic core having a core gap with substantially lower magnetic permeability than said magnetic core and said electromagnetic interfering distance is five times a length of said core gap.

12. The packaged integrated circuit as recited in claim 1, wherein said multi-layer substrate is formed with a ground plane under and insulated from said circuit traces.

13. The packaged integrated circuit as recited in claim 1, wherein said portion of said circuit traces is routed such that a normal is aligned substantially perpendicular to said orientation of said local magnetic field line of said magnetic field produced by said inductor.

14. The packaged integrated circuit as recited in claim 1, wherein said multi-layer substrate comprises conductive layers separated by insulating layers, one conductive layer of said conductive layers comprises a ground plane, and solder pads for a ball-grid array formed on an opposing surface to said surface.

15. The packaged integrated circuit as recited in claim 1, comprising another switch-mode regulator formed on said second semiconductor die or a third semiconductor die affixed to said surface of said multi-layer substrate.

16. The packaged integrated circuit as recited in claim 1, wherein said integrated circuit comprises a field programmable gate array.

17. The packaged integrated circuit as recited in claim 1, wherein said integrated circuit and said switch-mode regulator are encapsulated in epoxy to form said packaged integrated circuit.

18. The packaged integrated circuit as recited in claim 1, comprising a cover positioned over and thermally coupled to said first semiconductor die, said second semiconductor die and said multi-layer substrate.

19. The packaged integrated circuit as recited in claim 18, wherein said cover includes an elevated portion over said first semiconductor die and said second semiconductor die.

20. The packaged integrated circuit as recited in claim 1, wherein said electromagnetic interfering distance comprises a distance at which time-varying voltages induced by said inductor are capable of adversely affecting operation of said packaged integrated circuit due to physical properties of said inductor with respect to the packaged integrated circuit.

* * * * *